(12) United States Patent
Kasai et al.

(10) Patent No.: US 10,425,743 B2
(45) Date of Patent: Sep. 24, 2019

(54) CAPACITIVE TRANSDUCER AND ACOUSTIC SENSOR

(71) Applicant: OMRON Corporation, Kyoto (JP)

(72) Inventors: Takashi Kasai, Shiga (JP); Yusuke Nakagawa, Kyoto (JP)

(73) Assignee: OMRON Corporation, Kyoto (JP)

( * ) Notice: Subject to any disclaimer, the term of this patent is extended or adjusted under 35 U.S.C. 154(b) by 0 days.

(21) Appl. No.: 15/901,841

(22) Filed: Feb. 21, 2018

(65) Prior Publication Data

US 2018/0184211 A1    Jun. 28, 2018

Related U.S. Application Data

(63) Continuation of application No. PCT/JP2017/003299, filed on Jan. 31, 2017.

(30) Foreign Application Priority Data

Mar. 10, 2016  (JP) .................................. 2016-047307

(51) Int. Cl.
*H04R 19/00* (2006.01)
*H04R 19/04* (2006.01)
(Continued)

(52) U.S. Cl.
CPC ............. *H04R 19/005* (2013.01); *B81B 3/00* (2013.01); *B81B 3/0018* (2013.01); *H01L 29/84* (2013.01);
(Continued)

(58) Field of Classification Search
CPC ............................ H04R 19/005; H04R 1/222; H04R 2201/003; B81B 3/00; B81B 3/0018; B81B 3/0257; B81B 3/0264
See application file for complete search history.

(56) References Cited

U.S. PATENT DOCUMENTS

| 8,737,171 B2 | 5/2014 | Jenkins et al. |
| 2005/0194303 A1 | 9/2005 | Sniegowski et al. |

(Continued)

FOREIGN PATENT DOCUMENTS

| JP | 2008-259061 A | 10/2008 |
| JP | 2011-250170 A | 12/2011 |

(Continued)

OTHER PUBLICATIONS

Extended European Search Report issued in European Application No. 17762758.5, dated Jan. 29, 2019 (5 pages).
(Continued)

*Primary Examiner* — Sunita Joshi
(74) *Attorney, Agent, or Firm* — Osha Liang LLP

(57) ABSTRACT

A capacitive transducer includes a substrate having an opening in a surface thereof, a back plate facing the opening in the substrate, a vibration electrode film facing the back plate across a space, the vibration electrode film being deformable to have a deformation converted into a change in capacitance between the vibration electrode film and the back plate, the vibration electrode film having a through-hole as a pressure relief hole, and a protrusion integral with and formed from the same member as the back plate, the protrusion being placeable in the pressure relief hole before the vibration electrode film deforms. The pressure relief hole and the protrusion have a gap therebetween defining an airflow channel as a pressure relief channel. The protrusion has a through-hole extending from a distal portion of the protrusion to a portion of the back plate opposite to the protrusion.

7 Claims, 12 Drawing Sheets

(51) Int. Cl.
*H04R 1/22* (2006.01)
*H04R 7/16* (2006.01)
*B81B 3/00* (2006.01)
*H01L 29/84* (2006.01)

(52) U.S. Cl.
CPC .............. *H04R 1/222* (2013.01); *H04R 7/16* (2013.01); *H04R 19/04* (2013.01); *B81B 2201/0257* (2013.01); *B81B 2201/0264* (2013.01); *H04R 2201/003* (2013.01)

(56) References Cited

U.S. PATENT DOCUMENTS

| | | | |
|---|---|---|---|
| 2010/0212432 A1* | 8/2010 | Kasai | H04R 19/005 |
| | | | 73/654 |
| 2013/0069179 A1 | 3/2013 | Ishimoto et al. | |
| 2014/0353780 A1 | 12/2014 | Perletti et al. | |
| 2015/0078592 A1* | 3/2015 | Uchida | H04R 19/04 |
| | | | 381/191 |
| 2015/0078593 A1 | 3/2015 | Uchida | |
| 2015/0110309 A1 | 4/2015 | Park et al. | |

FOREIGN PATENT DOCUMENTS

| | | |
|---|---|---|
| JP | 2015-056832 A | 3/2015 |
| JP | 2015-056833 A | 3/2015 |

OTHER PUBLICATIONS

International Search Report issued in Application No. PCT/JP2017/003299, dated Apr. 4, 2017 (2 pages).
Written Opinion issued in Application No. PCT/JP2017/003299, dated Apr. 4, 2017 (3 pages).

* cited by examiner

CAPACITIVE TRANSDUCER AND ACOUSTIC SENSOR

BACKGROUND

Field

The disclosure relates to a capacitive transducer and an acoustic sensor including the capacitive transducer. The present invention particularly relates to a capacitive transducer with a capacitor structure including a vibration electrode film with the MEMS technology and a back plate, and to an acoustic sensor including the capacitive transducer.

Related Art

Small microphones known in the art may incorporate acoustic sensors called electret condenser microphones (ECMs). However, ECMs are susceptive to heat and are less suited to digitization and miniaturization than microphones incorporating capacitive transducers fabricated using the micro electro mechanical systems (MEMS) technology (hereafter, MEMS microphones). Thus, MEMS microphones have been increasingly used (refer to, for example, Patent Literature 1).

A capacitive transducer fabricated using the MEMS technology may include a vibration electrode film that vibrates under pressure and a back plate to which an electrode film is fixed. The vibration electrode film and the back plate are arranged to face each other across a space. The capacitive transducer with this structure may be achieved by, for example, forming a vibration electrode film on a silicon substrate, a sacrificial layer over the vibration electrode film, and a back plate on the sacrificial layer, and then removing the sacrificial layer. The MEMS technology, which is based on the semiconductor fabrication technology, enables fabrication of very small capacitive transducers.

However, capacitive transducers fabricated using the MEMS technology include a thin vibration electrode film and a thin back plate. The thin vibration electrode film may deform greatly and break under an excessively high pressure. The capacitive transducer may have this disadvantage when, for example, receiving an air blow in its mounting process or when the capacitive transducer falls, in addition to when receiving a large sound pressure.

In response to this, the vibration electrode film may have a pressure relief hole to relieve any excessively high pressure through the hole. However, this may degrade the frequency characteristics of the capacitive transducer, or may reduce the sensitivity within a low-frequency sound range.

Another technique is a MEMS transducer including a vibration electrode film and a plug portion separated from the vibration electrode film by slits. The plug portion is held by a support on a back plate or a substrate at the same level as the other part of the vibration electrode film. The vibration electrode film in this disclosure moves in accordance with the pressure difference across the film to enlarge the flow channel between the film and the plug portion, thus relieving an excessively high pressure (refer to, for example, Patent Literature 2).

Another known acoustic sensor converts an acoustic vibration into a change in the capacitance between a vibration electrode film and a fixed electrode film on a back plate and detects the acoustic vibration. This acoustic sensor includes a protrusion integral with the back plate, which is placed in a pressure relief hole in the vibration electrode film before the vibration electrode film deforms. When the vibration electrode film deforms away from the back plate under an excessively high pressure, the protrusion withdrawn from the pressure relief hole increases the area of air passage to relieve the pressure applied to the vibration electrode film.

When the vibration electrode film deforms away from the back plate under an excessively high pressure, this technique enables the protrusion to be withdrawn from the pressure relief hole to increase the area of the airflow channel. The protrusion integral with the back plate may typically be either columnar or tapered to have its diameter decreasing from the back plate.

When pressure is applied toward the back plate from the vibration electrode film in the acoustic sensor, the vibration electrode film moves toward the back plate. This causes the area of air passage to either remain constant or decrease, causing difficulties in relieving the pressure.

Patent Literature 1: Japanese Unexamined Patent Application Publication No. 2011-250170
Patent Literature 2: U.S. Pat. No. 8,737,171

SUMMARY

One or more aspects of the present invention are directed to a technique for reducing excessive deformation of a vibration electrode film deforming in any direction under an excessively high pressure applied to an acoustic sensor and preventing the vibration electrode film from breaking.

One aspect of the present invention provides a capacitive transducer including a substrate having an opening in a surface thereof, a back plate facing the opening in the substrate, a vibration electrode film facing the back plate across a space, and a protrusion integral with and formed from the same member as the back plate. The vibration electrode film is deformable to have a deformation converted into a change in capacitance between the vibration electrode film and the back plate. The vibration electrode film has a through-hole as a pressure relief hole. The protrusion is placeable in the pressure relief hole before the vibration electrode film deforms. The pressure relief hole and the protrusion have a gap therebetween defining an airflow channel as a pressure relief channel. The protrusion has a through-hole extending from a distal portion of the protrusion to a portion of the back plate opposite to the protrusion.

Under pressure applied from either the vibration electrode film or the back plate in the capacitive transducer, this structure allows the air associated with the pressure to partially pass through the through-hole in the protrusion, and escape to the other side of the back plate or the vibration electrode film without deforming the vibration electrode film. This increases the durability of the capacitive transducer against pressure.

This structure can reduce the sensitivity for the low frequency range in the frequency characteristics of the capacitive transducer. The resultant capacitive transducer can easily have immunity from noise, such as wind noise. This structure reduces the likelihood that any foreign matter in the air drawn into the capacitive transducer can come in contact with the vibration electrode film, the protrusion, or portions around the pressure relief hole, and thus can increase the durability against foreign matter.

In the above aspect, when the protrusion is in the pressure relief hole, the through-hole may be included in the pressure relief hole as viewed in a direction perpendicular to the vibration electrode film.

This structure limits the entry of air in the through-hole to the inside of the pressure relief hole as viewed in the direction perpendicular to the vibration electrode film, and thus prevents the air passing through the through-hole defined in the protrusion from affecting the behavior of the air in contact with the vibration electrode film. This can minimize the effect of air passing through the through-hole defined in the protrusion on the sensitivity or the frequency characteristics of the capacitive transducer.

In the above aspect, the through-hole may have a circular cross-section. This structure prevents stress concentration around the through-hole in the protrusion, and thus relatively increases the strength of the protrusion.

In the above aspect, the through-hole may have a cross-section with a width ranging from 1 to 50 μm inclusive. With the width of the cross-section of the through-hole (or the diameter of the cross-section of the circular through-hole) falling within this range, the capacitive transducer with a typical size using the MEMS technology can have sufficiently high sensitivity and sufficiently good frequency characteristics in practical use. The through-hole can be formed appropriately in semiconductor manufacturing processes.

Another aspect of the present invention provides an acoustic sensor including the above capacitive transducer. The acoustic sensor converts a sound pressure into a change in capacitance between the vibration electrode film and the back plate, and detects the sound pressure. This structure can increase the durability of the acoustic sensor against pressure. This structure can reduce the sensitivity for the low frequency range in the frequency characteristics of the acoustic transducer. The resultant acoustic transducer can have immunity from noise, such as wind noise. This structure can also increase the durability of the acoustic sensor against foreign matter.

The aspects may be combined as appropriate.

The capacitive transducer according to the above aspects can maintain good frequency characteristics during pressure detection, and prevents the vibration electrode film from deforming excessively in any direction under an excessively high pressure applied to the acoustic sensor and thus from breaking. The capacitive transducer can maintain better performance and have higher reliability.

DETAILED DESCRIPTION

First Embodiment

Embodiments of the present invention will now be described with reference to the drawings. The embodiments described below are mere examples of this invention and should not be construed as limiting the technical scope of the invention. Although the present invention is applicable to any electrostatic transducer, an electrostatic transducer used as an acoustic sensor will be described. However, a voice transducer according to the embodiments of the present invention may be used as any non-acoustic sensor for detecting the displacement of a vibration electrode film. For example, the transducer may be used as a pressure sensor, an acceleration sensor, or an inertial sensor. In addition, the transducer may be used as a non-sensor device such as a speaker for converting an electrical signal into a displacement. The components including a back plate, a vibration electrode film, a back chamber, and a substrate may be in any arrangement that provides the same functions as produced by the components arranged in the arrangement described below. For example, the back plate and the vibration electrode film may be reversed.

Figure 1:
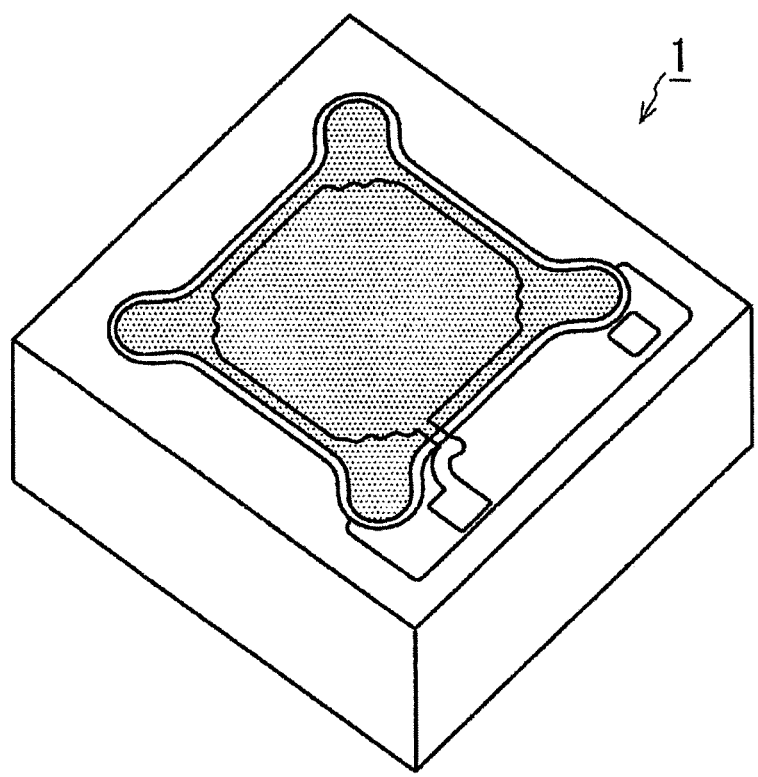
FIG. 1 is a perspective view of a known acoustic sensor fabricated using the MEMS technology.
Figure 2:
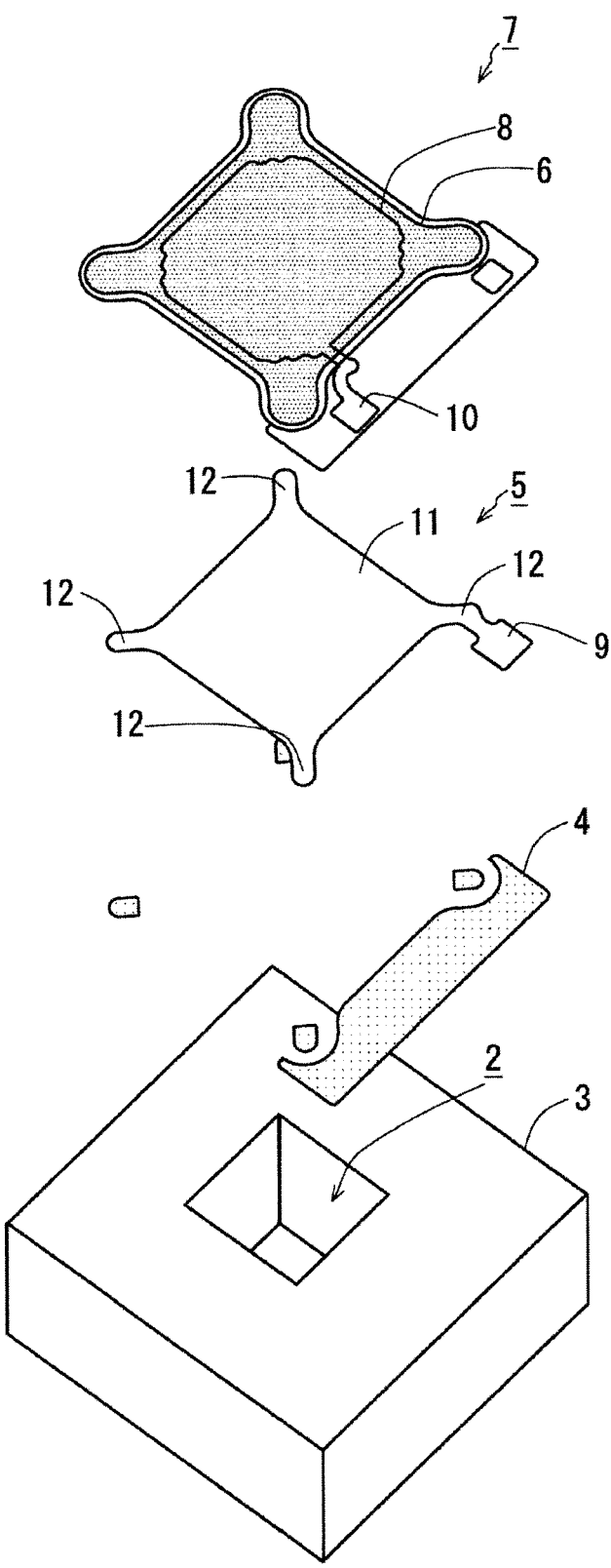
FIG. 2 is an exploded perspective view of the known acoustic sensor showing its internal structure.

FIG. 1 is a perspective view of a known acoustic sensor 1 fabricated using the micro electro mechanical system (MEMS) technology. FIG. 2 is an exploded perspective view of the acoustic sensor 1 showing its internal structure. The acoustic sensor 1 is a laminate of a silicon substrate (substrate) 3 having a back chamber 2, and a dielectric film 4, a vibration electrode film (diaphragm) 5, and a back plate 7 placed on the top surface of the silicon substrate 3. The back plate 7 includes a fixed plate 6 and a fixed electrode film 8 on the fixed plate 6 and adjacent to the silicon substrate 3. The fixed plate 6 in the back plate 7 has multiple sound holes or openings across it (the individual sound holes are indicated by the dots in the shaded area of the fixed plate 6 shown in FIGS. 1 and 2). The fixed electrode film 8 has a fixed electrode pad 10 for obtaining an output signal arranged at one of its four corners. The upward direction herein is the direction from the substrate 3 toward the fixed electrode film 8 in FIG. 2, whereas the downward direction herein is the opposite direction.

The silicon substrate 3 may be formed from, for example, single-crystal silicon. The vibration electrode film 5 may be formed from, for example, conductive polycrystalline silicon. The vibration electrode film 5 is thin and substantially rectangular, and has fixation parts 12 at the four corners of a substantially quadrilateral vibration part 11. The vibration electrode film 5 is located on the top surface of the silicon substrate 3 to cover the back chamber 2, and is fixed to the silicon substrate 3 at the four fixation parts 12 serving as anchor portions. The vibration part 11 of the vibration electrode film 5 vibrates vertically in response to sound pressure.

The vibration electrode film 5 is not in contact with the silicon substrate 3 nor with the back plate 7 except at its four fixation parts 12. The vibration electrode film 5 can thus vertically vibrate more smoothly in response to sound pressure. The vibration part 11 has a vibration film electrode pad 9 at one of the fixation parts 12 at the four corners. The fixed electrode film 8 on the back plate 7 corresponds to the vibration area of the vibration electrode film 5, which is the area excluding the fixation parts 12 at the four corners. The fixation parts 12 of the vibration electrode film 5 at the four corners do not vibrate in response to sound pressure and the capacitance remains unchanged between the vibration electrode film 5 and the fixed electrode film 8.

When the acoustic sensor 1 receives sound, the sound passes through the sound holes and applies sound pressure to the vibration electrode film 5. More specifically, the sound holes allow the sound pressure to be applied to the vibration electrode film 5. The sound holes also reduce thermal noise and thus reduce noise by allowing easy escape of air from the air gap between the back plate 7 and the vibration electrode film 5.

When the acoustic sensor 1 with the structure described above receives sound, the vibration electrode film 5 vibrates to change the distance between the vibration electrode film 5 and the fixed electrode film 8. In response to the change in the distance between the vibration electrode film 5 and the fixed electrode film 8, the capacitance between the vibration electrode film 5 and the fixed electrode film 8 changes. The sound pressure can be detected as an electrical signal by applying a direct current (DC) voltage across the vibration film electrode pad 9 electrically connected to the vibration electrode film 5 and the fixed electrode pad 10 electrically connected to the fixed electrode film 8, and converting the resulting change in the capacitance into an electrical signal.

Figure 3:
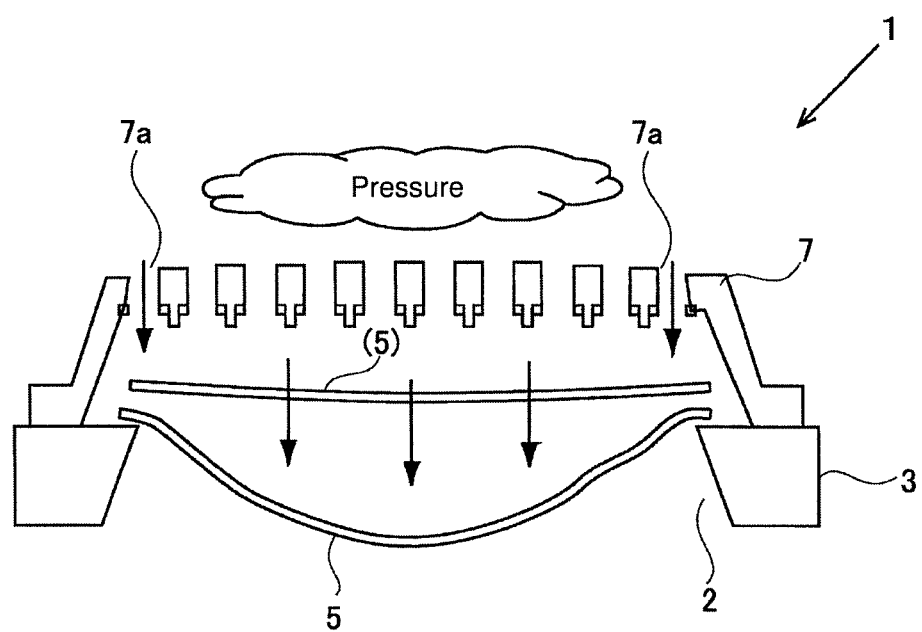
FIG. 3 is a diagram describing an acoustic sensor to which an excessively high pressure is abruptly applied.

The above acoustic sensor 1 known in the art may have the disadvantage described below. FIG. 3 is a schematic diagram showing the acoustic sensor 1 under an excessively high pressure. As shown in FIG. 3, when the acoustic sensor 1 receives an excessively high pressure, the large pressure may be applied to the vibration part 11 of the vibration electrode film 5 through sound holes 7a formed in the back plate 7. The large pressure may severely distort the vibration part 11 and break the vibration electrode film 5. This disadvantage may occur when, for example, the acoustic sensor 1 receives an excessive air pressure or when the acoustic sensor 1 falls.

Figure 4A:
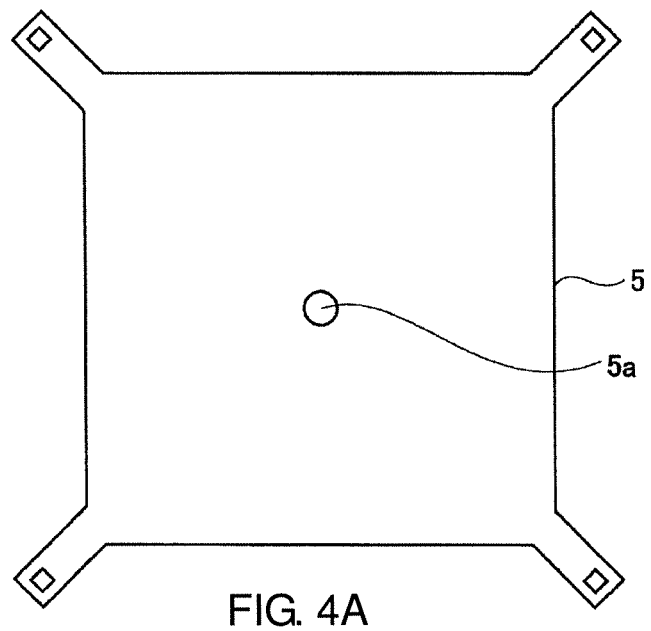
FIGS. 4A and 4B are diagrams describing a known response to an excessively high pressure abruptly applied to the acoustic sensor.
Figure 4B:
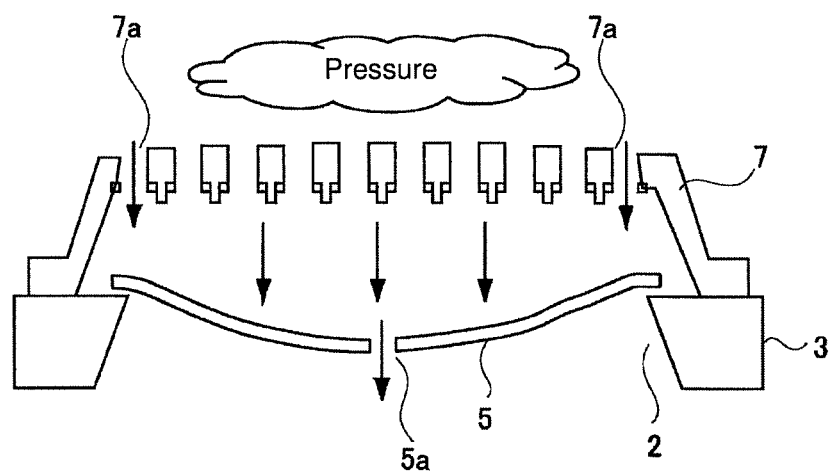

FIGS. 4A and 4B show a possible response to this. As shown in FIG. 4A, a hole 5a for relieving an applied pressure is formed in the vibration electrode film 5. As shown in FIG. 4B, an excessively high pressure applied through the sound holes 7a formed in the back plate 7 of the acoustic sensor 1 may be relieved through the hole 5a. This prevents the vibration electrode film 5 from breaking. However, although the hole 5a, which is normally open, formed in the vibration electrode film 5 improves the durability against pressure, the hole may reduce sensitivity, or may cause roll-off, particularly within a low-frequency sound range, and may degrade the frequency characteristics of the acoustic sensor 1.

Another response may be a vibration electrode film, and a plug portion separated from the vibration electrode film by slits included as a pressure relief measure. The plug portion may be held by a support on a back plate at the same level as the other part of the vibration electrode film. This vibration electrode film moves in accordance with the pressure difference across the film to enlarge the flow channel between the film and the plug portion, and the enlarged channel allows an excessively high pressure to be relieved (refer to, for example, Patent Literature 2).

However, this response has disadvantages described below. For example, the plug portion is fragile because it is a part of the very thin vibration electrode film. The lid-like plug portion is supported on the back plate using the support that is formed from a separate rod member. This complicates the manufacturing processes, and may cause the plug portion to come off the support.

Further, this vibration electrode film moves in accordance with the pressure difference across the film to enlarge the flow channel between the vibration electrode film and the plug portion, which is separated from the vibration electrode film by the slits. The enlarged channel then allows an excessively high pressure to be relieved. More specifically, the flow channel corresponds to the gap between the thin films, which are the vibration electrode film and the plug portion separated from the vibration electrode film by the slits. Thus, when the amplitude of the vibration electrode film increases under a relatively large pressure, which is within an operable pressure range, the plug portion and the vibration electrode film may deviate from each other beyond their film thickness. The resulting larger flow channel may cause unstable frequency characteristics of the acoustic sensor 1.

Another response to the above disadvantage is a vibration electrode film having a hole for relieving any applied pressure. Before the vibration electrode film deforms, a column integral with and protruding from a back plate passes through and partially blocks the hole. When the vibration electrode film deforms under pressure, the relative movement of the vibration electrode film and the back plate causes the back plate column to withdraw from the hole and uncover the entire hole, through which the pressure applied to the vibration electrode film is relieved.

Figure 5A:
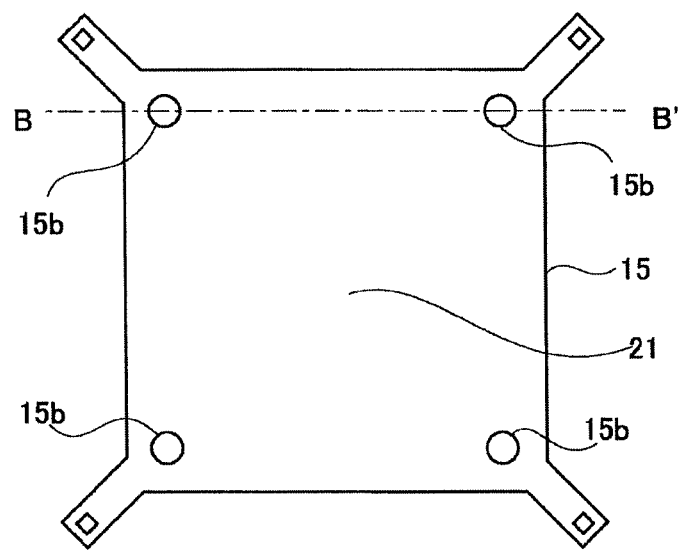
FIGS. 5A and 5B are diagrams describing another known response to an excessively high pressure abruptly applied to the acoustic sensor.
Figure 5B:
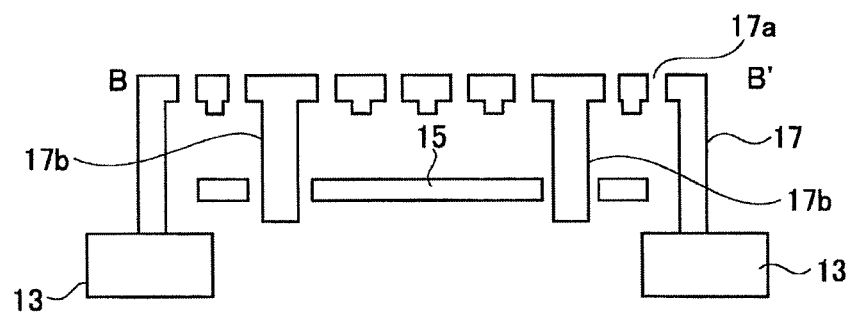

FIGS. 5A and 5B are schematic views of an acoustic sensor showing a part a vibration electrode film 15 and a back plate 17 in the above structure. FIG. 5A is a plan view of the vibration electrode film 15. FIG. 5B is a cross-sectional view taken along line B-B', showing the vibration electrode film 15, the back plate 17, and a substrate 13. As shown in FIG. 5A, pressure relief holes 15b are opened at the four corners of a vibration part 21 of the vibration electrode film 15 according to this measure. As shown in FIG. 5B, a columnar protrusion 17b integral with the back plate 17 passes through and blocks the pressure relief hole 15b before the vibration electrode film 15 receives an excessively high pressure. The protrusion 17b is parts of the back plate 17 that is formed when the back plate 17 is prepared through semiconductor manufacturing processes.

Figure 6A:
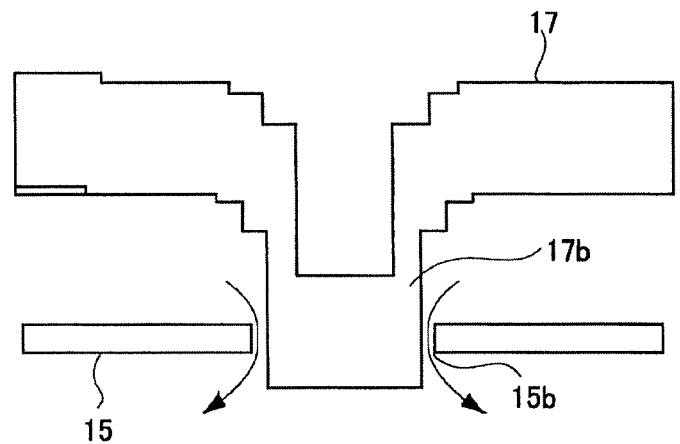
FIGS. 6A and 6B are diagrams describing the functions of a pressure relief hole and a protrusion in the known response to an excessively high pressure abruptly applied to the acoustic sensor.
Figure 6B:
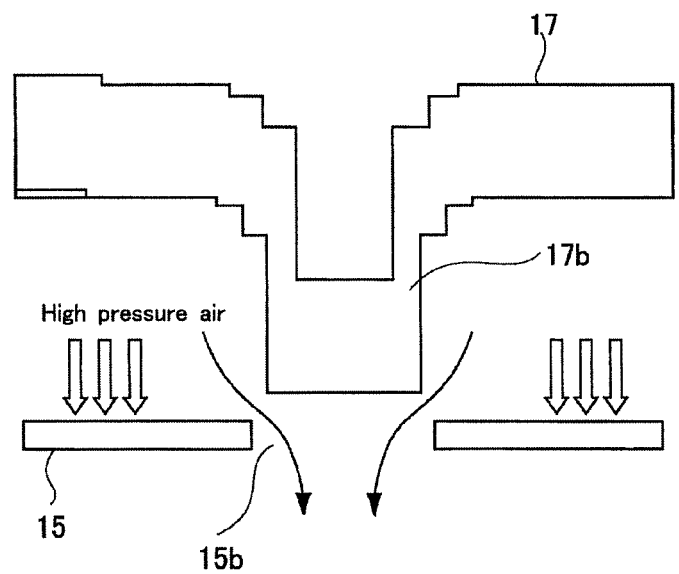

The functions of the pressure relief holes 15b and the protrusions 17b will now be described with reference to FIGS. 6A and 6B. FIG. 6A shows the structure in which the vibration electrode film 15 has yet to receive an excessively high pressure. FIG. 6B shows the structure in which the vibration electrode film 15 has received an excessively high pressure and deformed greatly. As shown in FIG. 6A, before the vibration electrode film 15 deforms, each protrusion 17b on the back plate 17 passes through and blocks the corresponding pressure relief hole 15b in the vibration electrode film 15. In this state, when pressure is applied to the vibration electrode film 15 from across the back plate 17, the pressure relief hole 15b allows less air to pass, and insufficiently relieves pressure.

However, when the vibration electrode film 15 is under an excessively high pressure, the vibration electrode film 15 greatly deforms away from the back plate 17 as shown in FIG. 6B. This causes the protrusion 17b to withdraw from the pressure relief hole 15b (the protrusion to no longer pass through the hole) and uncover the pressure relief hole 15b. The air applying the pressure to the vibration electrode film 15 passes through the pressure relief hole 15b downward in the figures. This instantaneously relieves the pressure applied to the vibration electrode film 15. The pressure relief prevents the vibration electrode film 15 from deforming further after the protrusion 17b withdraws from the pressure relief hole 15b, thus preventing the vibration electrode film 15 from breaking.

Figure 7A:
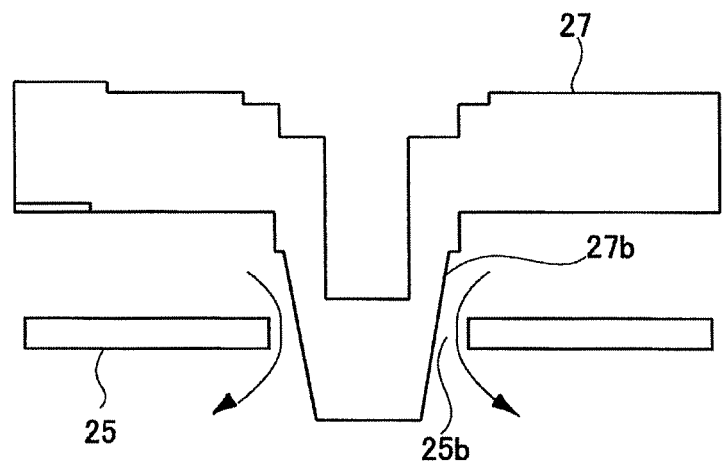
FIGS. 7A and 7B are diagrams describing the functions of a pressure relief hole and a protrusion in the known response to an excessively high pressure abruptly applied to the acoustic sensor.
Figure 7B:
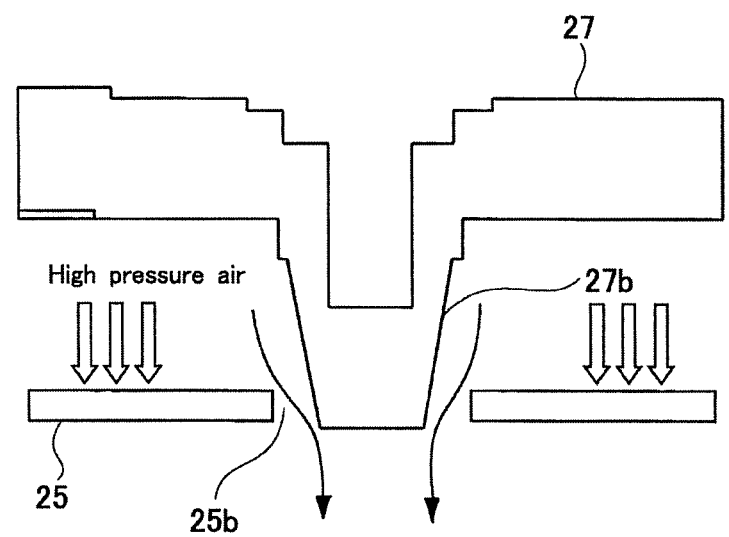

FIGS. 7A and 7B show an example of the above structure including a steplessly and linearly tapered protrusion 27b. In this structure, when a vibration electrode film 25 deforms greatly under an excessively high pressure applied to the vibration electrode film 25, a more distal, small-diameter part of the protrusion 27b passes through a pressure relief hole 25b. This increases the area of air passage for relieving pressure, and prevents the vibration electrode film 25 from deforming excessively.

The known structures described above cannot increase the area of air passage for relieving pressure when the vibration electrode film deforms upward under pressure applied from below, and thus cannot prevent the vibration electrode film from deforming excessively upward. In the structure having the protrusion 27b with a diameter decreasing steplessly toward the distal end, the vibration electrode film 25 deforming upward reduces the area of air passage for relieving pressure, and thus cannot prevent the vibration electrode film 25 from deforming excessively upward.

The overall durability against the pressure applied upward from below may be seemingly improved by increasing the gap between the protrusion and the pressure relief hole. However, the mass and the repelling force of the air inherent in the space may prevent air from entering the space defined by the back plate and the vibration electrode film through the gap between the protrusion and the pressure relief hole, causing difficulties in improving the durability against pressure.

Figure 8:
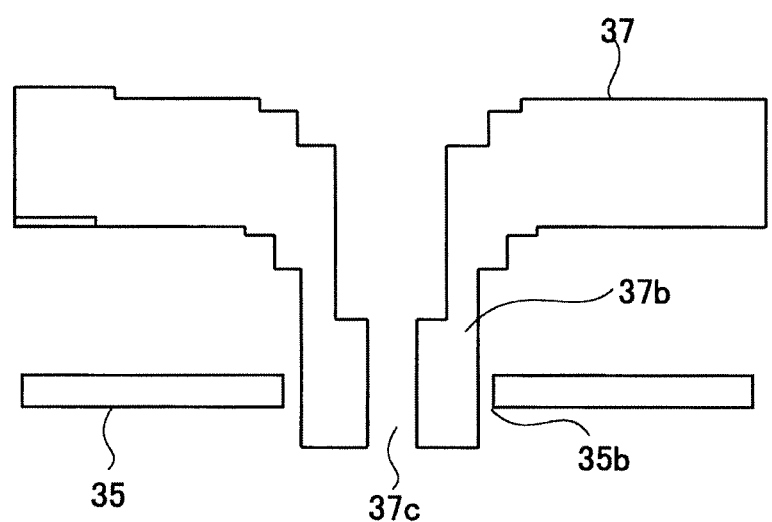
FIG. 8 is a cross-sectional view of a protrusion according to a first embodiment of the present invention.
Figure 9A:
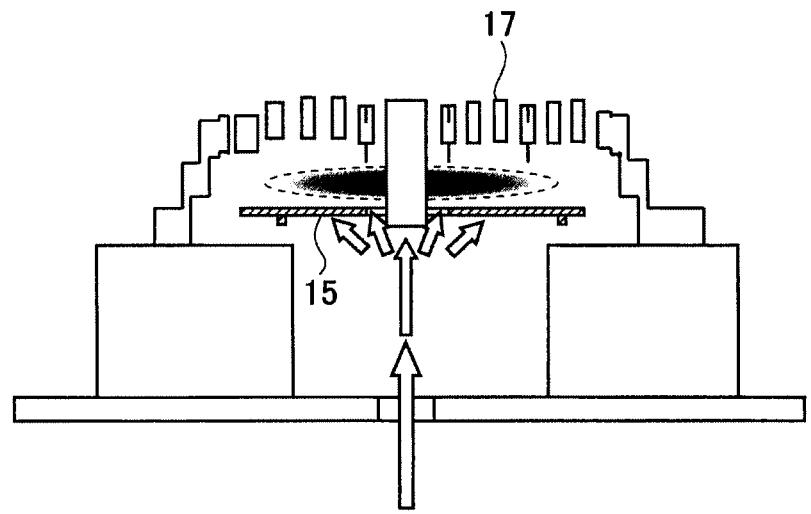
FIGS. 9A and 9B are diagrams describing the functions of a back plate and a vibration electrode film according to the first embodiment of the present invention.
Figure 9B:
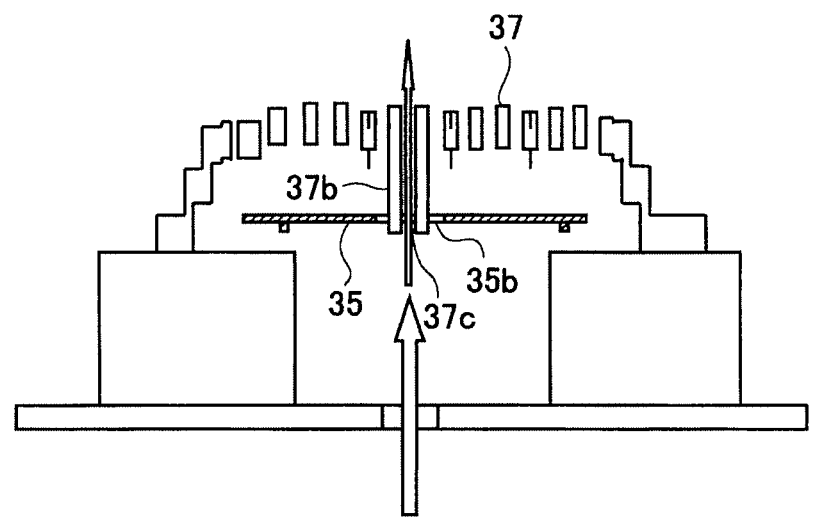

In response to this, the structure according to the present embodiment includes a protrusion 37b with a protrusion hole 37c, which is a vertical through-hole, as shown in FIG. 8. This structure allows part of the air under the vibration electrode film to escape to above the back plate through the protrusion hole 37c when the vibration electrode film deforms upward under pressure applied from below, thus preventing the vibration electrode film from deforming excessively upward. FIGS. 9A and 9B are diagrams describing the functions of the protrusion 37b on a back plate 37 and a pressure relief hole 35b in a vibration electrode film 35 according to the present embodiment. FIG. 9A shows the protrusion of the back plate 17 and the pressure relief hole in the vibration electrode film 15 known in the art. FIG. 9B shows the protrusion 37b of the back plate 37 and the pressure relief hole 35b in the vibration electrode film 35 according to the present embodiment.

In the known structure, as shown in FIG. 9A, air drawn into the capacitive transducer flows toward the space defined by the back plate 17 and the vibration electrode film 15 through the gap between the protrusion of the back plate 17 and the pressure relief hole in the vibration electrode film 15. However, the mass and the repelling force of the air inherent in the space may prevent the air from entering the space through the gap between the protrusion and the pressure relief hole, causing difficulties in increasing the durability against pressure.

As shown in FIG. 9B, the structure according to the present embodiment allows part of the air drawn into the capacitive transducer to directly escape to above the back plate 37 through the protrusion hole 37c in the protrusion 37b. This allows the pressure to partially escape more efficiently without being affected by the air in the space defined by the back plate 37 and the vibration electrode film 35, and increases the durability against pressure.

In the present embodiment, part of the air drawn into the capacitive transducer can directly flow to the other side of the back plate 37 without affecting the vibration electrode film 35. This reduces the sensitivity for the low frequency range in the frequency characteristics of the capacitive transducer, and thus can eliminate noise, such as wind noise.

In the present embodiment, foreign matter entering the capacitive transducer with air can be directly delivered to above the back plate through the protrusion hole 37c. This prevents the foreign matter from touching the vibration electrode film 35 and from accumulating or being caught in areas around the vibration electrode film 35 and the back plate 37.

Figure 10A:
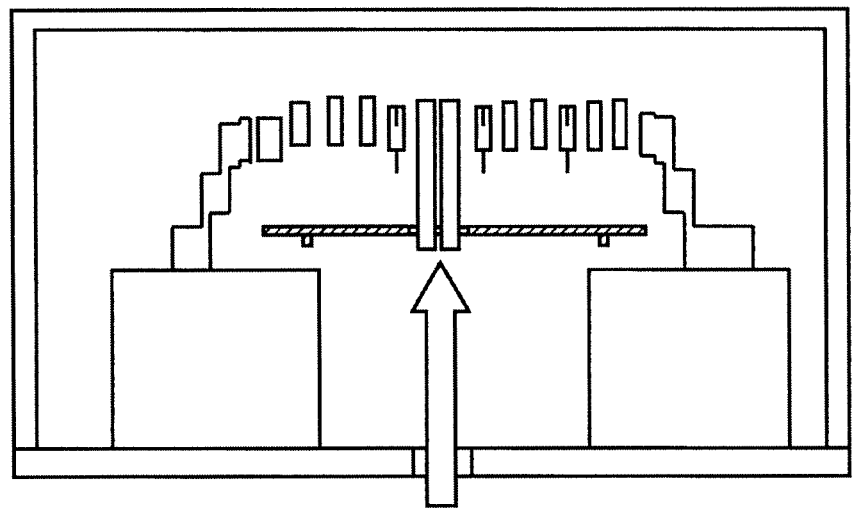
FIGS. 10A and 10B are diagrams describing the results of pressure tests for the structure including a back plate with a known protrusion and the structure including a back plate with a protrusion according to the first embodiment of the present invention.
Figure 10B:
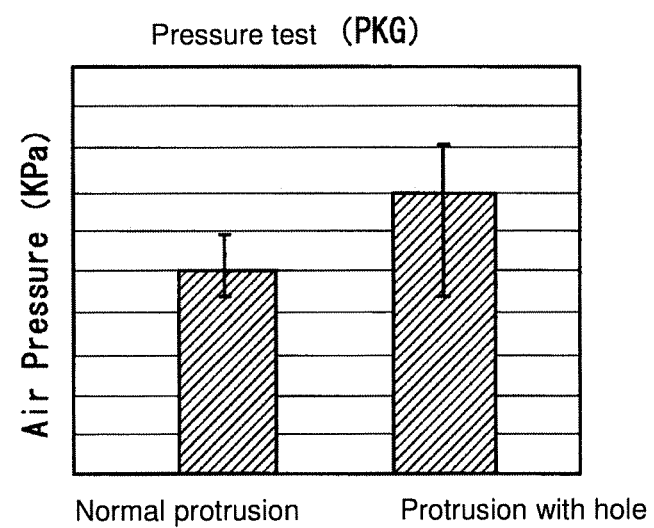

FIGS. 10A and 10B show the results of pressure tests using the structure with the known protrusion and the structure with the protrusion 37b according to the present embodiment. In the pressure tests, compressed air is applied through sound holes in each package incorporating the corresponding capacitive transducer to measure the strength. FIG. 10A is a conceptual diagram describing the operation in the pressure tests, whereas FIG. 10B is a graph showing the results of the pressure tests.

As shown in FIG. 10B, the structure with the protrusion 37b having the protrusion hole 37c according to the present embodiment shows about 40% higher durability against air pressure than the structure with the known protrusion 17b. In the pressure tests, the vibration film receives pressure applied from below when the compressed air enters, and receives pressure applied from above when the compressed air escapes to complete the tests. In the structure according to the present embodiment, air escapes through the gap between the protrusion 37b and the pressure relief hole 35b and also through the protrusion hole 37c to the area below the vibration electrode film 35 under pressure applied to the back plate 37 from above as well, thus seemingly improving the durability against air pressure.

Second Embodiment

A second embodiment of the present invention will now be described. Although the structure according to the first embodiment includes the back plate having the protrusion with the protrusion hole, the structure according to the present embodiment includes a back plate having a tapered protrusion with a diameter decreasing gradually toward its distal end with a protrusion hole.

Figure 11A:
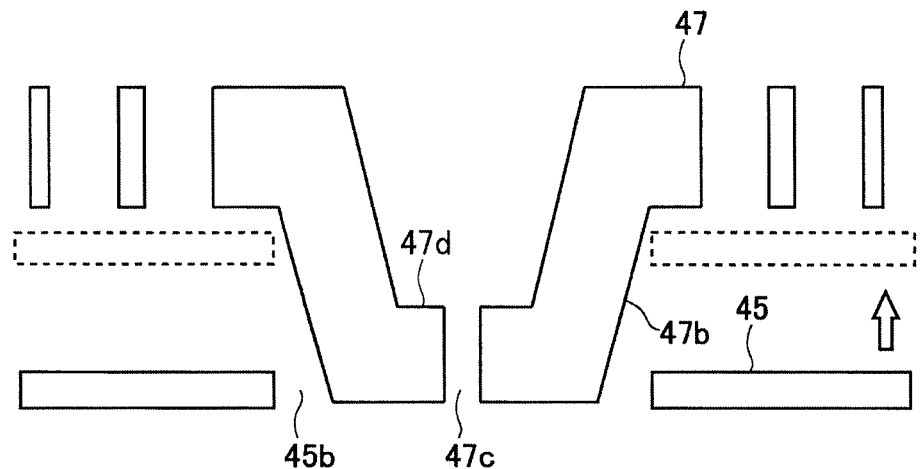
FIGS. 11A and 11B are cross-sectional views each showing a protrusion formed on a back plate and a pressure relief hole formed in a vibration electrode film according to a second embodiment.
Figure 11B:
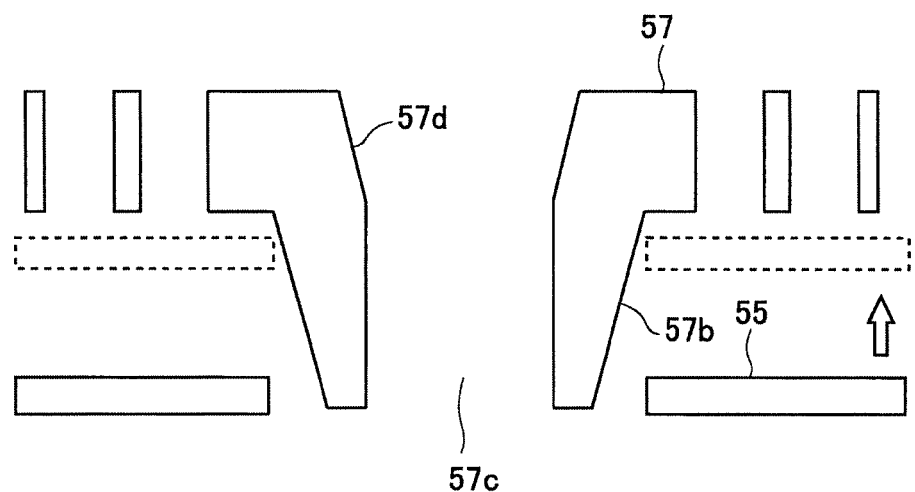

FIGS. 11A and 11B are cross-sectional views each showing a protrusion on a back plate and part of a vibration electrode film around a pressure relief hole according to the present embodiment. FIG. 11A shows the structure including a tapered protrusion 47b having a diameter decreasing gradually toward its distal end and including a protrusion hole 47c formed a flat part 47d of the bottom of its inner wall. FIG. 11B shows the structure including a tapered protrusion 57b having a diameter decreasing gradually toward its distal end and including a protrusion hole 57c with an inclined surface 57d of its inner wall.

The structures shown in FIGS. 11A and 11B include the protrusions 47b and 57b, each of which is tapered and has a diameter decreasing gradually toward the distal end. When the vibration electrode film 45 or 55 deforms downward under an excessively high pressure applied from above, the more distal, smaller diameter part of the protrusion 47b or 57b passes through the pressure relief hole 45b or 55b before the protrusion 47b or 57b withdraws from the pressure relief hole 45b or 55b. This increases the area of air passage for relieving pressure and thus prevents the vibration electrode films 45 and 55 from deforming excessively.

Additionally, the protrusion hole 47c or 57c in the protrusion 47b or 57b in the present embodiment allows part of air drawn into the capacitive transducer to escape to the area below the vibration electrode film 45 or 55. This allows the pressure to partially escape when the vibration electrode film 45 or 55 greatly deforms downward under an excessively high pressure from above, thus increasing the durability against pressure in a more reliable manner.

However, when the vibration electrode film 45 or 55 greatly deforms upward under an excessively high pressure applied from below, the tapered shape of the protrusion 47b or 57b alone is insufficient to increase the area of air passage for relieving pressure and to prevent the vibration electrode film from deforming excessively upward. In the present embodiment, the protrusion hole 47c or 57c according to the present embodiment allows the air under the vibration electrode film 45 or 55 to escape to the area above the back plate 47 or 57, thus increasing the durability against pressure in a more reliable manner.

Third Embodiment

A third embodiment of the present invention will now be described. In the present embodiment, various modifications of protrusion holes formed in a substantially cylindrical protrusion will be described.

Figure 12A:
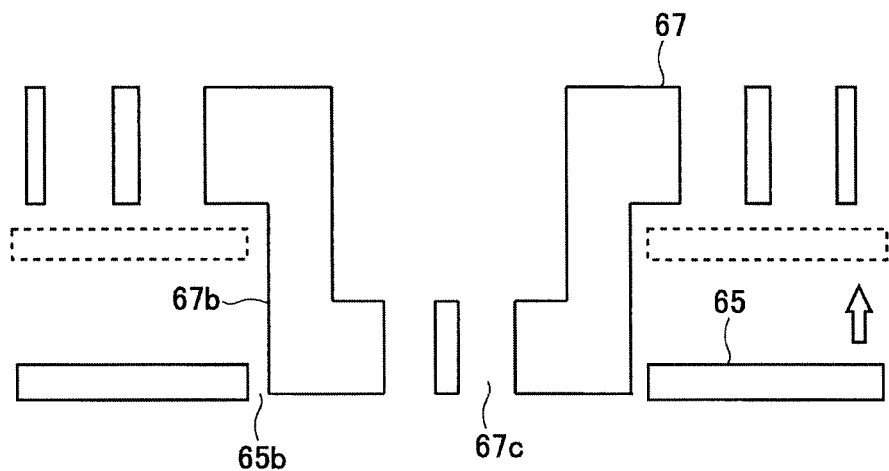
FIGS. 12A and 12B are cross-sectional views each showing a protrusion formed on a back plate and a pressure relief hole formed in a vibration electrode film according to a third embodiment.
Figure 12B:
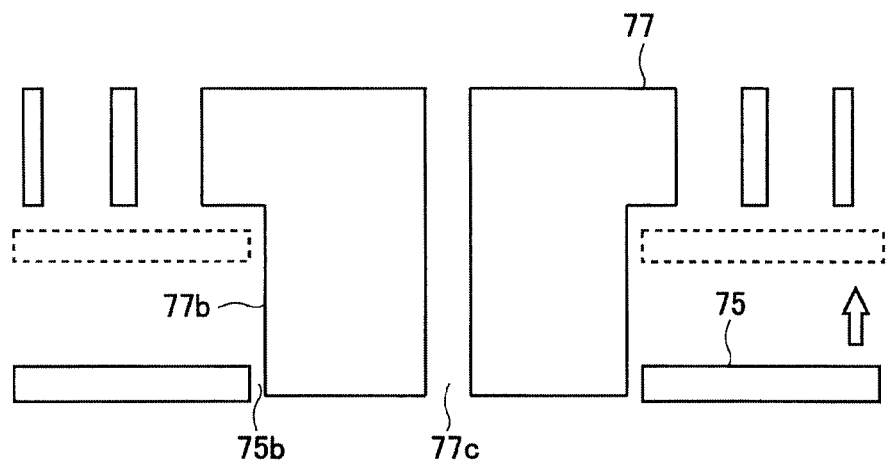

FIGS. 12A and 12B show modifications of protrusion holes in the structure according to the present embodiment. FIG. 12A shows the structure including two protrusion holes 67c formed in a cylindrical protrusion 67b on a back plate 67. In this modification, the protrusion holes together provide a broader area of air passage while maintaining the strength of the protrusion 67b.

FIG. 12B shows the structure including a through-hole as a protrusion hole 77c formed in a solid protrusion 77b. This structure produces the same advantageous effects as the structure including a protrusion including a protrusion hole formed from a thin film through the formation process of a thinner silicon nitride (SiN) film.

In the above embodiment, the diameters and the number of protrusion holes may be modified as appropriate in accordance with the sensitivity or the frequency characteristics to be achieved by the capacitive transducer. The protrusion hole may have any cross-section but may have a circular cross-section, which can reduce stress concentration in the protrusion and thus relatively increase the strength of the protrusion. For a typical microphone with a several millimeters square using the MEMS technology, an excessively wide protrusion hole can greatly degrade the frequency characteristics, whereas an excessively small protrusion hole may be difficult to form through semiconductor manufacturing processes. Considering these, a protrusion hole may have a cross-sectional width (or a cross-sectional diameter for a circular protrusion hole) of 1 to 50 μm, inclusive.

REFERENCE SIGNS LIST 1 acoustic sensor
2 back chamber
3, 13 (silicon) substrate
5, 15, 25, 35, 45, 55, 65, 75 vibration electrode film
7, 17, 27, 37, 47, 57, 67, 77 back plate
15b, 25b, 35b, 45b, 55b, 65b, 75b pressure relief hole
17b, 27b, 37b, 47b, 57b, 67b, 77b protrusion
37c, 47c, 57c, 67c, 77c protrusion hole

The invention claimed is:

1. A capacitive transducer, comprising:
a substrate having an opening in a surface thereof;
a back plate facing the opening in the substrate;
a vibration electrode film facing the back plate across a space, the vibration electrode film being deformable to have a deformation converted into a change in capacitance between the vibration electrode film and the back plate, the vibration electrode film having a through-hole as a pressure relief hole; and
a protrusion integral with and formed from the same member as the back plate, the protrusion being placeable in the pressure relief hole before the vibration electrode film deforms,
wherein the pressure relief hole and the protrusion have a gap therebetween defining an airflow channel as a pressure relief channel,
wherein the protrusion has a through-hole extending from a distal portion of the protrusion to a portion of the back plate opposite to the protrusion, and
wherein, when the protrusion is in the pressure relief hole, the through-hole is included in the pressure relief hole as viewed in a direction perpendicular to the vibration electrode film.

2. The capacitive transducer according to claim 1, wherein the through-hole has a circular cross-section.

3. The capacitive transducer according to claim 1, wherein the through-hole has a cross-section with a width ranging from 1 to 50 μm, inclusive.

4. An acoustic sensor comprising:
the capacitive transducer according to claim 1,
wherein the acoustic sensor is configured to convert a sound pressure into a change in capacitance between the vibration electrode film and the back plate, and detect the sound pressure.

5. The capacitive transducer according to claim 2, wherein the through-hole has a cross-section with a width ranging from 1 to 50 μm, inclusive.

6. An acoustic sensor comprising:
the capacitive transducer according to claim 2,
wherein the acoustic sensor is configured to convert a sound pressure into a change in capacitance between the vibration electrode film and the back plate, and detect the sound pressure.

7. An acoustic sensor comprising:
the capacitive transducer according to claim 3,
wherein the acoustic sensor is configured to convert a sound pressure into a change in capacitance between the vibration electrode film and the back plate, and detect the sound pressure.

* * * * *